(12) United States Patent
Hsu et al.

(10) Patent No.: US 10,483,140 B2
(45) Date of Patent: Nov. 19, 2019

(54) MASK TRANSMISSION EQUIPMENT

(71) Applicant: Winbond Electronics Corp., Taichung (TW)

(72) Inventors: Chia-Lu Hsu, Taichung (TW); Yao-Nan Su, Tainan (TW); Chen-Ya Cheng, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/193,342

(22) Filed: Nov. 16, 2018

(65) Prior Publication Data

US 2019/0228999 A1 Jul. 25, 2019

(30) Foreign Application Priority Data

Jan. 19, 2018 (CN) .......................... 2018 1 0052268

(51) Int. Cl.
*H01L 21/673* (2006.01)
*H01L 21/677* (2006.01)

(52) U.S. Cl.
CPC .. *H01L 21/67359* (2013.01); *H01L 21/67383* (2013.01); *H01L 21/6773* (2013.01)

(58) Field of Classification Search
USPC ............................ 206/710.711; 220/669, 670
See application file for complete search history.

(56) References Cited

U.S. PATENT DOCUMENTS

| | | | |
|---|---|---|---|
| 9,097,980 B2 | 8/2015 | Ku et al. | |
| 2012/0018347 A1* | 1/2012 | Ku | H01L 21/67353 206/710 |
| 2012/0267380 A1* | 10/2012 | Ku | G03F 1/66 220/669 |
| 2014/0231305 A1* | 8/2014 | Dejima | H01L 21/6732 206/711 |
| 2018/0068882 A1* | 3/2018 | Kato | H01L 21/67359 |
| 2018/0102269 A1* | 4/2018 | Liu | H01L 21/67359 |

FOREIGN PATENT DOCUMENTS

TW 201242863 A 11/2012
TW M456582 U 7/2013

* cited by examiner

*Primary Examiner* — Jacob K Ackun
(74) *Attorney, Agent, or Firm* — Muncy, Geissler, Olds & Lowe, P.C.

(57) ABSTRACT

A mask transmission equipment is provided. The mask transmission equipment includes a wafer transmission container and a supporting bracket. The wafer transmission container includes a plurality of first positioning grooves and a plurality of second positioning grooves. The first positioning grooves face the second positioning grooves. The first positioning grooves and the second positioning grooves are adapted to position a plurality of wafers. The supporting bracket is disposed in the wafer transmission container. The supporting bracket includes a first supporting unit, a second supporting unit, a first wing and a second wing. The first supporting unit is stacked on the second supporting unit. The first wing is disposed on a first side of the supporting bracket. The second wing is disposed on a second side of the supporting bracket. The first side is opposite to the second side.

14 Claims, 5 Drawing Sheets

MASK TRANSMISSION EQUIPMENT

CROSS REFERENCE TO RELATED APPLICATIONS

This Application claims priority of China Patent Application No. 201810052268.8, filed on Jan. 19, 2018, the entirety of which is incorporated by reference herein.

BACKGROUND OF THE INVENTION

Field of the Invention

The present invention relates to mask transmission equipment, and in particular to mask transmission equipment utilizing a wafer transmission container for transporting mask boxes.

Description of the Related Art

Conventionally, when one single wafer transmission container is utilized to transport a plurality of mask boxes, the wafer positioning structures inside the wafer transmission container must be removed, and a metal bracket is mounted in the wafer transmission container to support the mask boxes. However, removing the wafer positioning structures requires time and effort. The wafer transmission container which has no wafer positioning structures cannot transport wafers again. To transport the wafers and the mask boxes, the number of wafer transmission containers in the factory is increased. The large number wafer transmission containers take up space, and increase the manufacturing cost.

BRIEF SUMMARY OF THE INVENTION

In one embodiment, mask transmission equipment is provided. The mask transmission equipment includes a wafer transmission container and a supporting bracket. The wafer transmission container includes a plurality of first positioning grooves and a plurality of second positioning grooves. The first positioning grooves face the second positioning grooves. The first positioning grooves and the second positioning grooves are adapted to position a plurality of wafers, and each first positioning groove and the corresponding second positioning groove are adapted to position one of the wafers. The supporting bracket is disposed in the wafer transmission container. The supporting bracket includes a first supporting unit, a second supporting unit, a first wing and a second wing. The first supporting unit is stacked on the second supporting unit. The first wing is disposed on a first side of the supporting bracket. The second wing is disposed on a second side of the supporting bracket. The first side is opposite to the second side. The first wing is inserted into one of the first positioning grooves. The second wing is inserted into one of the second positioning grooves.

Utilizing the mask transmission equipment of the embodiment, the mask boxes can be transported by one wafer transmission container. The wafer transmission container is directly connected to the supporting bracket without additional refit. After the wafer transmission container transports the mask boxes, the wafer transmission container can still be directly utilized to transport wafers.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
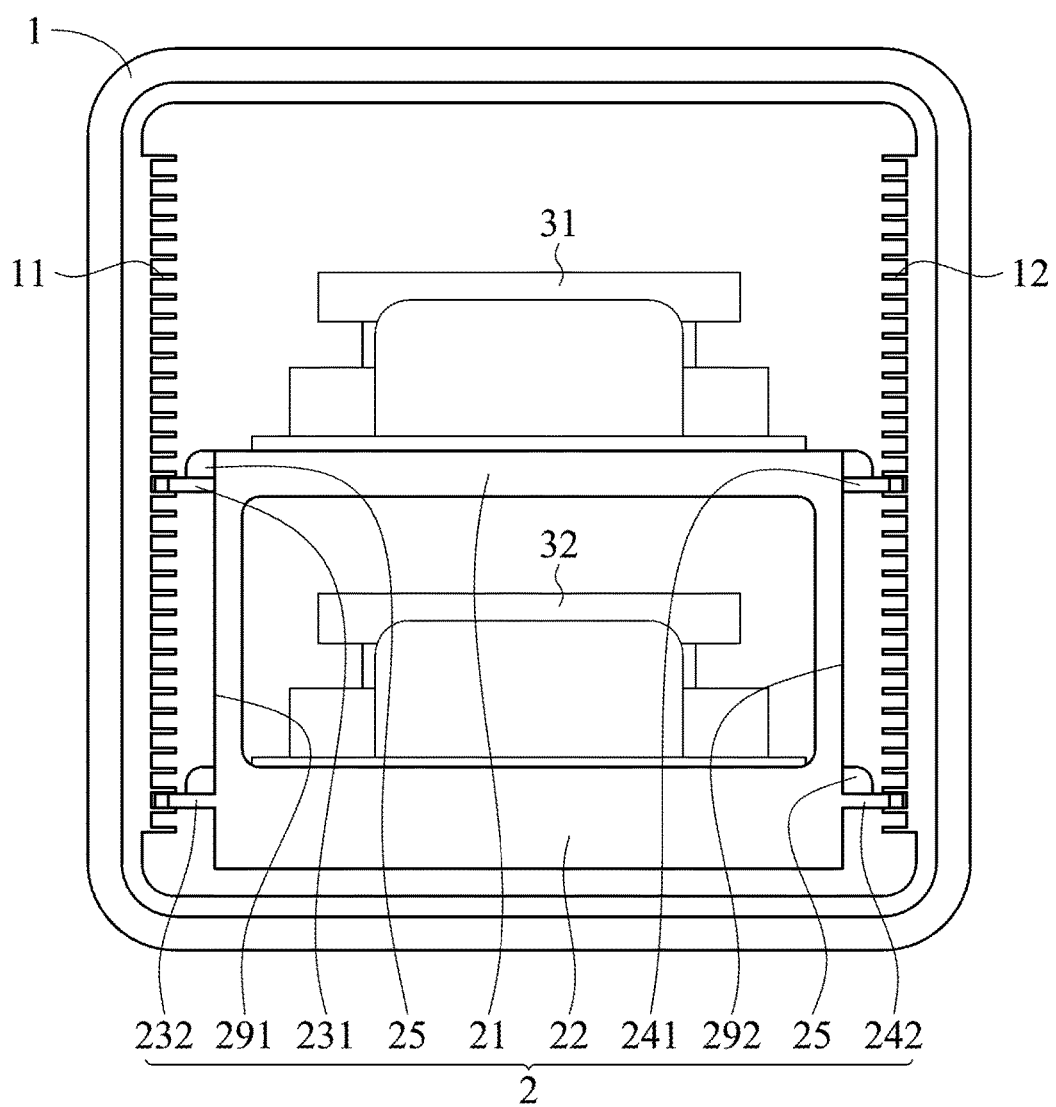
FIG. 1 shows mask transmission equipment of an embodiment of the invention.

FIG. 1 shows mask transmission equipment T of an embodiment of the invention. The mask transmission equipment T includes a wafer transmission container 1, a supporting bracket 2, a first mask box 31 and a second mask box 32. The wafer transmission container 1 includes a plurality of first positioning grooves 11 and a plurality of second positioning grooves 12. The first positioning grooves 11 face the second positioning grooves 12. The first positioning grooves 11 and the second positioning grooves 12 are adapted to position a plurality of wafers (not shown). The supporting bracket 2 is disposed in the wafer transmission container 1. The supporting bracket 2 includes a first supporting unit 21, a second supporting unit 22, a first wing 231 and a second wing 241. The first supporting unit 21 is stacked on the second supporting unit 22. The first wing 231 is disposed on a first side 291 of the supporting bracket 2. The second wing 241 is disposed on a second side 292 of the supporting bracket 2. The first side 291 is opposite to the second side 292. The first wing 231 is inserted into one of the first positioning grooves 11. The second wing 241 is inserted into one of the second positioning grooves 12. The first mask box 31 is placed on the first supporting unit 21. The second mask box 32 is disposed on the second supporting unit 22.

Figure 2:
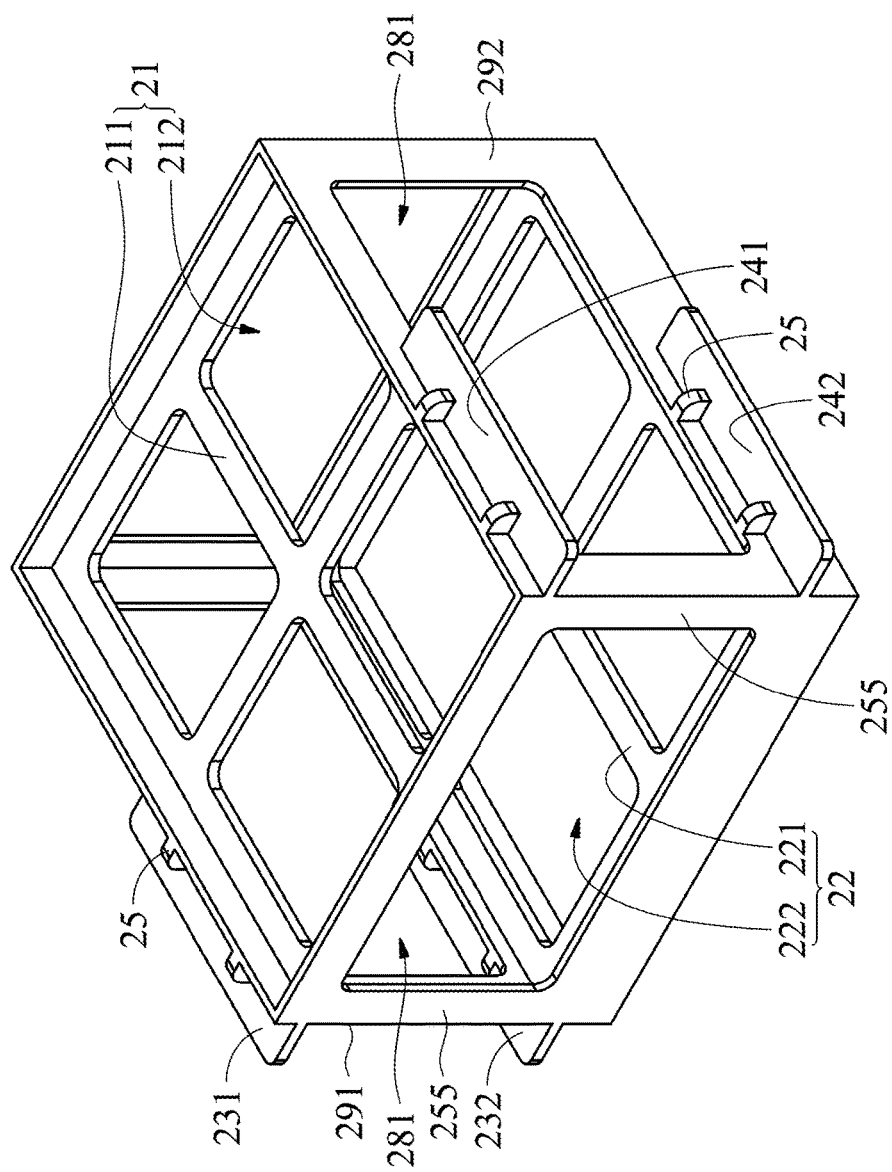
FIG. 2 shows the details of the supporting bracket of the embodiment of the invention.

FIG. 2 shows the details of the supporting bracket 2. With reference to FIG. 2, in this embodiment, the second supporting unit 22 comprises a plurality of posts 225. The posts 225 are connected to a bottom side of the first supporting unit 21. In one embodiment, the number of posts 225 is four, and a plurality of hollow portions 281 are formed between the posts 225. The hollow portions 281 reduce the weight of the supporting bracket 2.

With reference to FIG. 2, in one embodiment, the first supporting unit 21 comprises a first supporting portion 211. The first mask box 31 contacts the first supporting portion 211. The second supporting unit 22 comprises a second supporting portion 221. The second mask 32 contacts the second supporting portion 221. A plurality of first openings 212 are formed on the first supporting portion 211. A plurality of second openings 222 are formed on the second supporting portion 221. In one embodiment, both the first supporting portion 211 and the second supporting portion 221 comprise a cross-shaped structure.

Figure 3:
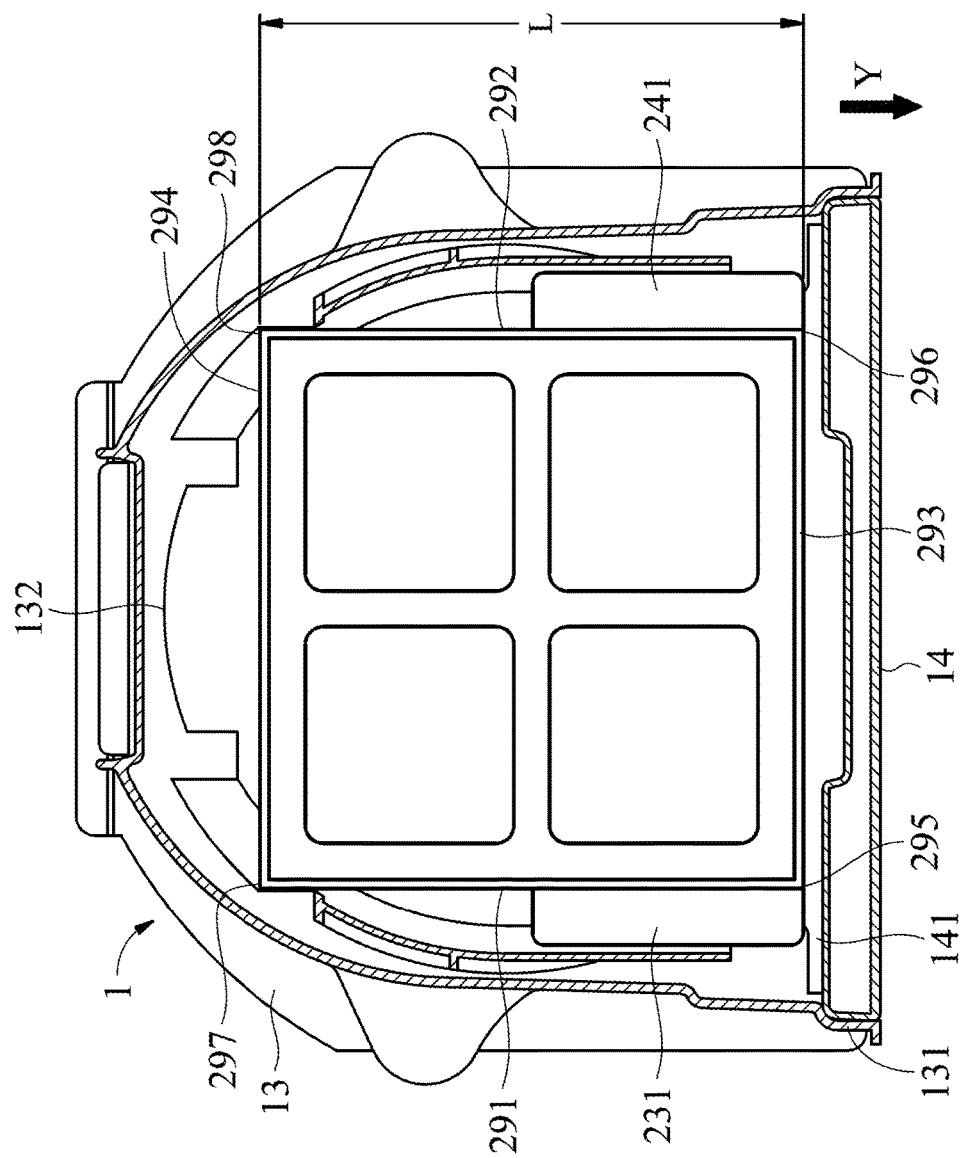
FIG. 3 shows the supporting bracket disposed inside the wafer transmission container of the embodiment of the invention.

With reference to FIG. 3, in one embodiment, the wafer transmission container 1 comprises a container body 13 and a cover 14. The container body 13 comprises a container opening 131. The cover 14 covers the container opening 131. The supporting bracket 2, the first mask box 31 and the second mask box 32 are received in the container body.

With reference to FIG. 3, in this embodiment, the first wing and the second wing are rectangular. In one embodiment, the supporting bracket 2 comprises a third side 293 and a fourth side 294. The third side 293 is opposite to the fourth side 294. The third side 293 faces the container opening 131. A bracket length L is formed between the third side 293 and the fourth side 294 in a first direction Y. The extending length of the first wing 231 in the first direction Y is greater than one-third of the bracket length L. The extending length of the second wing 241 in the first direction Y is greater than one-third of the bracket length L. Therefore, the supporting bracket 2 can be firmly affixed inside the wafer transmission container 1.

With reference to FIGS. 1 and 2, in this embodiment, the supporting bracket 2 further comprises a third wing 232 and a fourth wing 242. The first wing 231 and the second wing 241 correspond to the first supporting unit 21. The third wing 232 and the fourth wing 242 correspond to the second supporting unit 22. The third wing 232 is disposed on the first side 291 of the supporting bracket 2. The fourth wing 242 is disposed on the second side 292 of the supporting bracket 2. The third wing 232 is inserted into one of the first positioning grooves 11. The fourth wing 242 is inserted into one of the second positioning grooves 12.

In this embodiment, the supporting bracket 2 further comprises the third wing 232 and the fourth wing 242. However, the disclosure is not meant to restrict the invention. In another embodiment, the supporting bracket 2 can merely include the first wing 231 and the second wing 241, and is wedged to the positioning grooves via the first wing 231 and the second wing 241. In the embodiment of the invention, the number and the position of the wings of the supporting bracket 2 can be modified.

With reference to FIG. 1, in one embodiment, the third wing 232 is inserted into the first positioning groove 11, which is the second one from the bottom, and the fourth wing 242 is inserted into the second positioning groove 12, which is the second one from the bottom. The operator therefore can easily determine whether the supporting bracket 2 is properly fastened to the wafer transmission container 1.

With reference to FIG. 3, in one embodiment, the cover 14 comprises a buffer portion 141. The supporting bracket 2 further comprises a first corner 295 and a second corner 296. The first corner 295 and the second corner 296 are located on the third side 293. The buffer portion 141 abuts the first corner 295 and the second corner 296. Therefore, the supporting bracket 2 can be properly fastened to the wafer transmission container 1.

With reference to FIG. 3, in one embodiment, the container body 13 comprises a curved inner wall 132. The curved inner wall 132 faces the container opening 131. The supporting bracket 2 further comprises a third corner 297 and a fourth corner 298. The third corner 297 and the fourth corner 298 are located on the fourth side 294. The third corner 297 and the fourth corner 298 abut the curved inner wall 132. Therefore, the supporting bracket 2 can be properly fastened to the wafer transmission container 1.

With reference to FIGS. 1 and 2, in one embodiment, the supporting bracket 2 further comprises a plurality of ribs 25. The ribs 25 are disposed on the first wing 231, the second wing 241, the third wing 232 and the fourth wing 242. Therefore, the strengths of the first wing 231, the second wing 241, the third wing 232 and the fourth wing 242 are improved.

Utilizing the mask transmission equipment of the embodiment, the mask boxes can be transported by one wafer transmission container. The wafer transmission container is directly connected to the supporting bracket without additional refit. After the wafer transmission container transports the mask boxes, the wafer transmission container can still be directly utilized to transport wafers.

Figure 4:
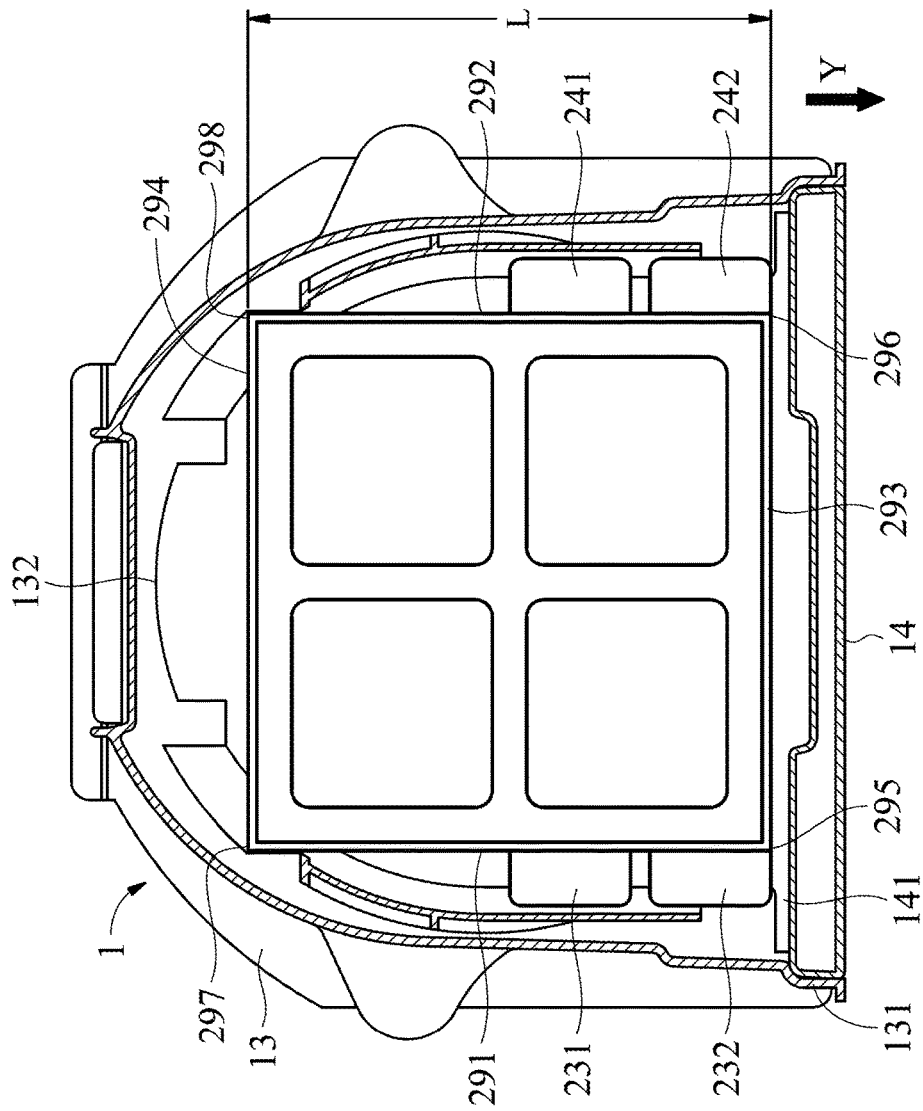
FIG. 4 shows mask transmission equipment of another embodiment of the invention.

With reference to FIG. 4, in another embodiment, the third wing 232 is located between the container opening 131 and the first wing 231. The fourth wing 242 is located between the container opening 131 and the second wing 241. In one embodiment, the bracket length L is formed between the third side 293 and the fourth side 294 in a first direction Y. The extending length of the first wing 231 in the first direction Y is shorter than one-third of the bracket length L. The extending length of the second wing 241 in the first direction Y is shorter than one-third of the bracket length L. The extending length of the third wing 232 in the first direction Y is shorter than one-third of the bracket length L. The extending length of the fourth wing 242 in the first direction Y is shorter than one-third of the bracket length L.

In the embodiments above, when the supporting bracket 2 merely includes the first wing 231 and the second wing 241, the extending length of the first wing 231 in the first direction Y and the extending length of the second wing 241 in the first direction Y are preferably both greater than one-third of the bracket length L. However, when the supporting bracket 2 includes the first wing 231, the second wing 241, the third wing 232 and the fourth wing 242, and the second wing 241 is staggered with the fourth wing 242, the extending length of the first wing 231 in the first direction Y is shorter than one-third of the bracket length L, the extending length of the second wing 241 in the first direction Y is shorter than one-third of the bracket length L, the extending length of the third wing 232 in the first direction Y is shorter than one-third of the bracket length L, and the extending length of the fourth wing 242 in the first direction Y is shorter than one-third of the bracket length L.

Figure 5:
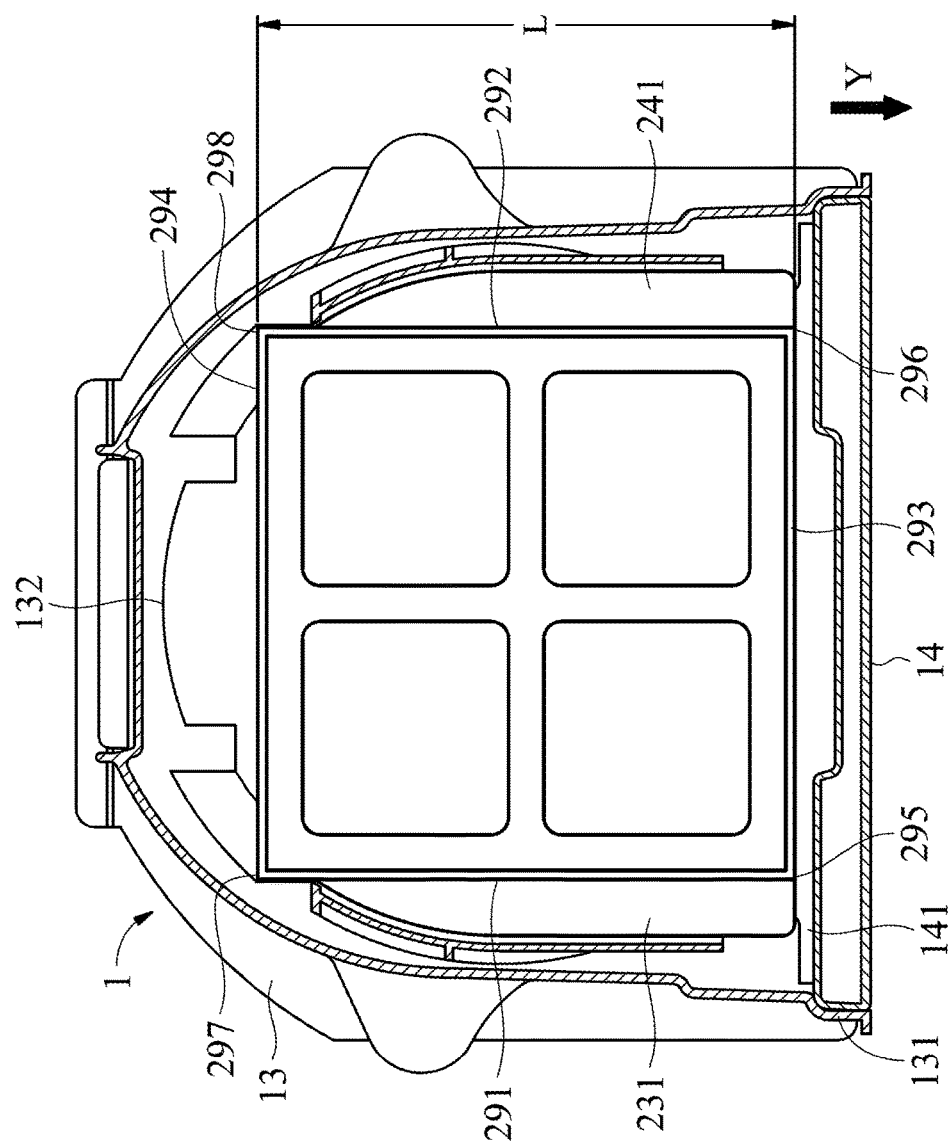
FIG. 5 shows mask transmission equipment of further another embodiment of the invention.

With reference to FIG. 5, in another embodiment, the shapes of the first wing 231 and the second wing 241 can match the shape of the curved inner wall 132. For example, the first wing 231 and the second wing 241 are Clark-Y wings. Therefore, the supporting bracket 2 can be properly fastened to the wafer transmission container 1.

In one embodiment, the supporting bracket can be made of Polycarbonate (PC), polyetheretherketone (PEEK), Acrylonitrile Butadiene Styrene (ABS) or Anti-static materials. The disclosure is not meant to restrict the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mask transmission equipment, comprising:
a wafer transmission container, comprising a plurality of first positioning grooves and a plurality of second positioning grooves, wherein the first positioning grooves face the second positioning grooves, the first positioning grooves and the second positioning grooves are adapted to position a plurality of wafers, and each first positioning groove and the corresponding second positioning groove are adapted to position one of the wafers; and
a supporting bracket, disposed in the wafer transmission container, comprising a first supporting unit, a second supporting unit, a first wing and a second wing, wherein the first supporting unit is stacked on the second supporting unit, the first wing is disposed on a first side of the supporting bracket, the second wing is disposed on a second side of the supporting bracket, the first side is opposite to the second side, the first wing is inserted into one of the first positioning grooves, and the second wing is inserted into one of the second positioning grooves.

2. The mask transmission equipment as claimed in claim 1, wherein the second supporting unit comprises a plurality of posts, and the posts are connected to a bottom side of the first supporting unit.

3. The mask transmission equipment as claimed in claim 2, wherein the number of posts is four, and a plurality of hollow portions are formed between the posts.

4. The mask transmission equipment as claimed in claim 1, wherein the first supporting unit comprises a first supporting portion, the second supporting unit comprises a second supporting portion, a plurality of first openings are formed on the first supporting portion, and a plurality of second openings are formed on the second supporting portion.

5. The mask transmission equipment as claimed in claim 4, wherein both the first supporting portion and the second supporting portion comprise a cross-shaped structure.

6. The mask transmission equipment as claimed in claim 1, wherein the first wing and the second wing are Clark-Y wings.

7. The mask transmission equipment as claimed in claim 1, wherein the wafer transmission container comprises a container body and a cover, the container body comprises a container opening, the cover covers the container opening, and the supporting bracket is received in the container body.

8. The mask transmission equipment as claimed in claim 7, wherein the supporting bracket comprises a third side and a fourth side, the third side is opposite to the fourth side, the third side faces the container opening, a bracket length is formed between the third side and the fourth side in a first direction, an extending length of the first wing in the first direction is greater than one-third of the bracket length, and the extending length of the second wing in the first direction is greater than one-third of the bracket length.

9. The mask transmission equipment as claimed in claim 7, wherein the supporting bracket further comprises a third wing and a fourth wing, the first wing and the second wing correspond to the first supporting unit, the third wing and the fourth wing correspond to the second supporting unit, the third wing is disposed on the first side of the supporting bracket, and the fourth wing is disposed on the second side of the supporting bracket.

10. The mask transmission equipment as claimed in claim 9, wherein the supporting bracket comprises a third side and a fourth side, the third side is opposite to the fourth side, the third side faces the container opening, the third wing is located between the container opening and the first wing, and the fourth wing is located between the container opening and the second wing.

11. The mask transmission equipment as claimed in claim 10, wherein a bracket length is formed between the third side and the fourth side in a first direction, an extending length of the first wing in the first direction is shorter than one-third of the bracket length, the extending length of the second wing in the first direction is shorter than one-third of the bracket length, the extending length of the third wing in the first direction is shorter than one-third of the bracket length, and the extending length of the fourth wing in the first direction is shorter than one-third of the bracket length.

12. The mask transmission equipment as claimed in claim 7, wherein the cover comprises a buffer portion, the supporting bracket further comprises a third side, a fourth side, a first corner and a second corner, the third side is opposite to the fourth side, the third side faces the container opening, the first corner and the second corner are located on the third side, and the buffer portion abuts the first corner and the second corner.

13. The mask transmission equipment as claimed in claim 12, wherein the container body comprises a curved inner wall, the curved inner wall faces the container opening, the supporting bracket further comprises a third corner and a fourth corner, the third corner and the fourth corner are located on the fourth side, and the third corner and the fourth corner abut the curved inner wall.

14. The mask transmission equipment as claimed in claim 1, wherein when the supporting bracket is in the wafer transmission container, the first positioning grooves and the second positioning grooves without connected to the supporting bracket are empty.

* * * * *